(12) United States Patent
Bliss et al.

(10) Patent No.: US 10,855,107 B2
(45) Date of Patent: Dec. 1, 2020

(54) SYSTEM AND METHOD FOR GENERATING A TRANSMISSION LINE RELIABILITY RATING

(71) Applicant: LINDSEY MANUFACTURING CO., Azusa, CA (US)

(72) Inventors: Ryan Bliss, Lindon, UT (US); Keith Lindsey, La Canada Flintridge, CA (US); John McCall, Rancho Cucamonga, CA (US)

(73) Assignee: Lindsey Manufacturing Co., Azusa, CA (US)

( * ) Notice: Subject to any disclaimer, the term of this patent is extended or adjusted under 35 U.S.C. 154(b) by 411 days.

(21) Appl. No.: 15/582,528

(22) Filed: Apr. 28, 2017

(65) Prior Publication Data

US 2018/0316219 A1    Nov. 1, 2018

(51) Int. Cl.

| | |
|---|---|
| *G01R 19/00* | (2006.01) |
| *H02J 13/00* | (2006.01) |
| *G01S 17/88* | (2006.01) |
| *H02J 3/00* | (2006.01) |
| *G01R 31/08* | (2020.01) |

(52) U.S. Cl.
CPC .......... *H02J 13/0017* (2013.01); *G01S 17/88* (2013.01); *H02J 3/00* (2013.01); *G01R 31/085* (2013.01); *H02J 2203/20* (2020.01)

(58) Field of Classification Search
CPC .... H02J 13/0017; H02J 3/00; H02J 2003/007; G01S 17/88; G01R 31/085
USPC .......................................................... 702/64
See application file for complete search history.

(56) References Cited

U.S. PATENT DOCUMENTS

| | | | | |
|---|---|---|---|---|
| 4,728,887 A | * | 3/1988 | Davis ..................... | G01R 15/14 |
| | | | | 324/127 |
| 9,519,014 B2 | | 12/2016 | Aaserude et al. | |
| 2013/0066600 A1 | * | 3/2013 | Rousselle ................ | H02J 3/00 |
| | | | | 703/1 |

(Continued)

FOREIGN PATENT DOCUMENTS

| | | | | |
|---|---|---|---|---|
| EP | | 3096428 A1 * | 11/2016 | ............... H02J 3/00 |
| WO | WO 2014/165217 A2 | | 10/2014 | |

OTHER PUBLICATIONS

International Search Report and Written Opinion issued in corresponding PCT Application No. PCT/US2018/027656, dated Jun. 26, 2018, 11 pages.

*Primary Examiner* — Toan M Le
*Assistant Examiner* — Xiuqin Sun
(74) *Attorney, Agent, or Firm* — Lewis Roca Rothgerber Christie LLP

(57) ABSTRACT

A system and method for determining a reliability line rating for a transmission line is disclosed. In response to a line clearance measurement and a line temperature measurement received from a transmission line monitor coupled to a transmission line, the system generates a temperature-clearance model for the transmission line based on the received line clearance measurement and line temperature measurement. The system generates a plurality of past dynamic line ratings and determines a scaling factor based on the plurality of past dynamic line ratings. The system then generates a dynamic line rating for an interval of time in the future and scales the dynamic line rating in response to the scaling factor to obtain a reliability line rating for the interval.

20 Claims, 10 Drawing Sheets

(56) References Cited

U.S. PATENT DOCUMENTS

2014/0180616 A1* 6/2014 Aaserude ............... G01R 27/02
 702/65
2014/0278756 A1* 9/2014 Saul ....................... G06Q 50/26
 705/7.29

* cited by examiner

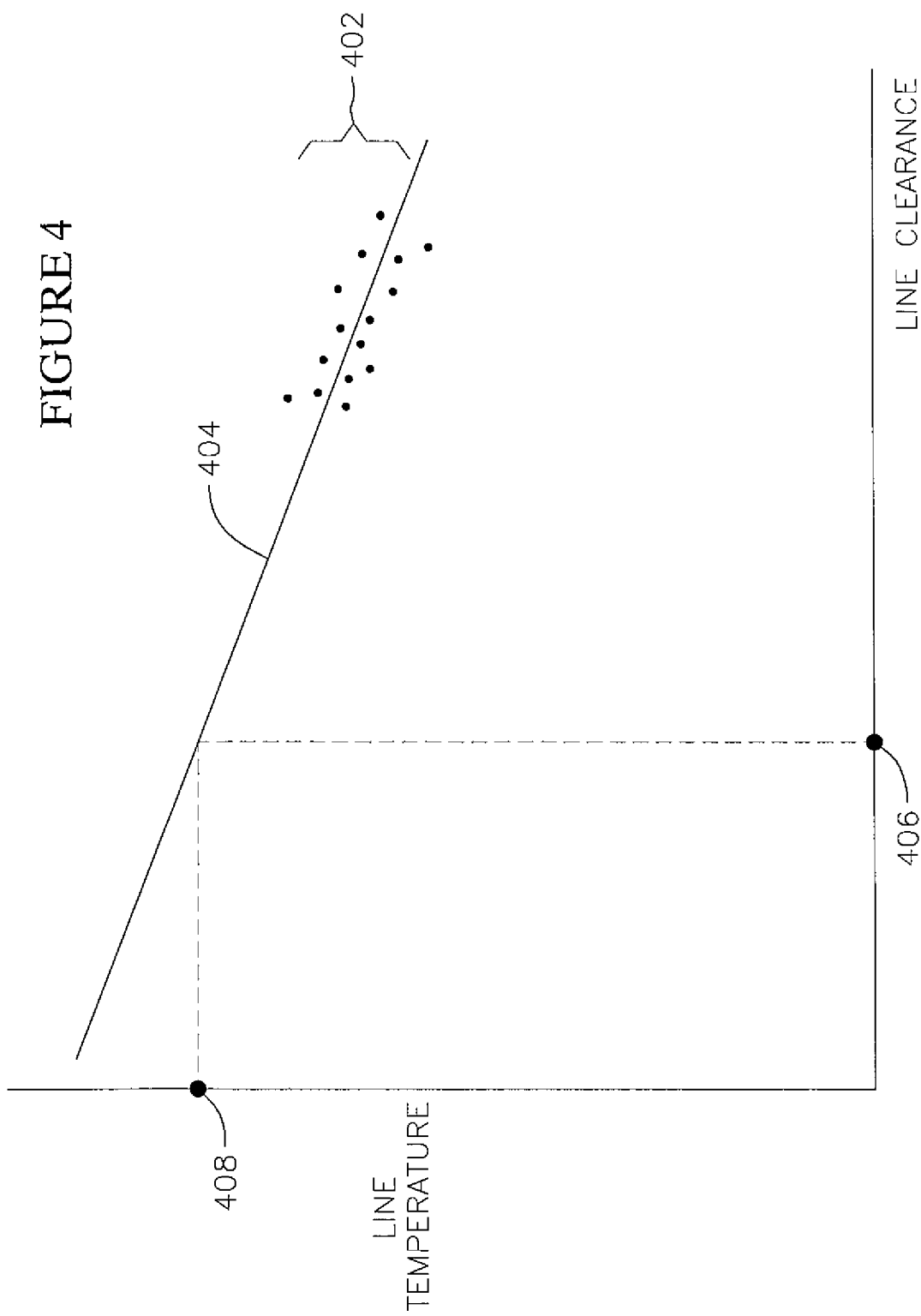

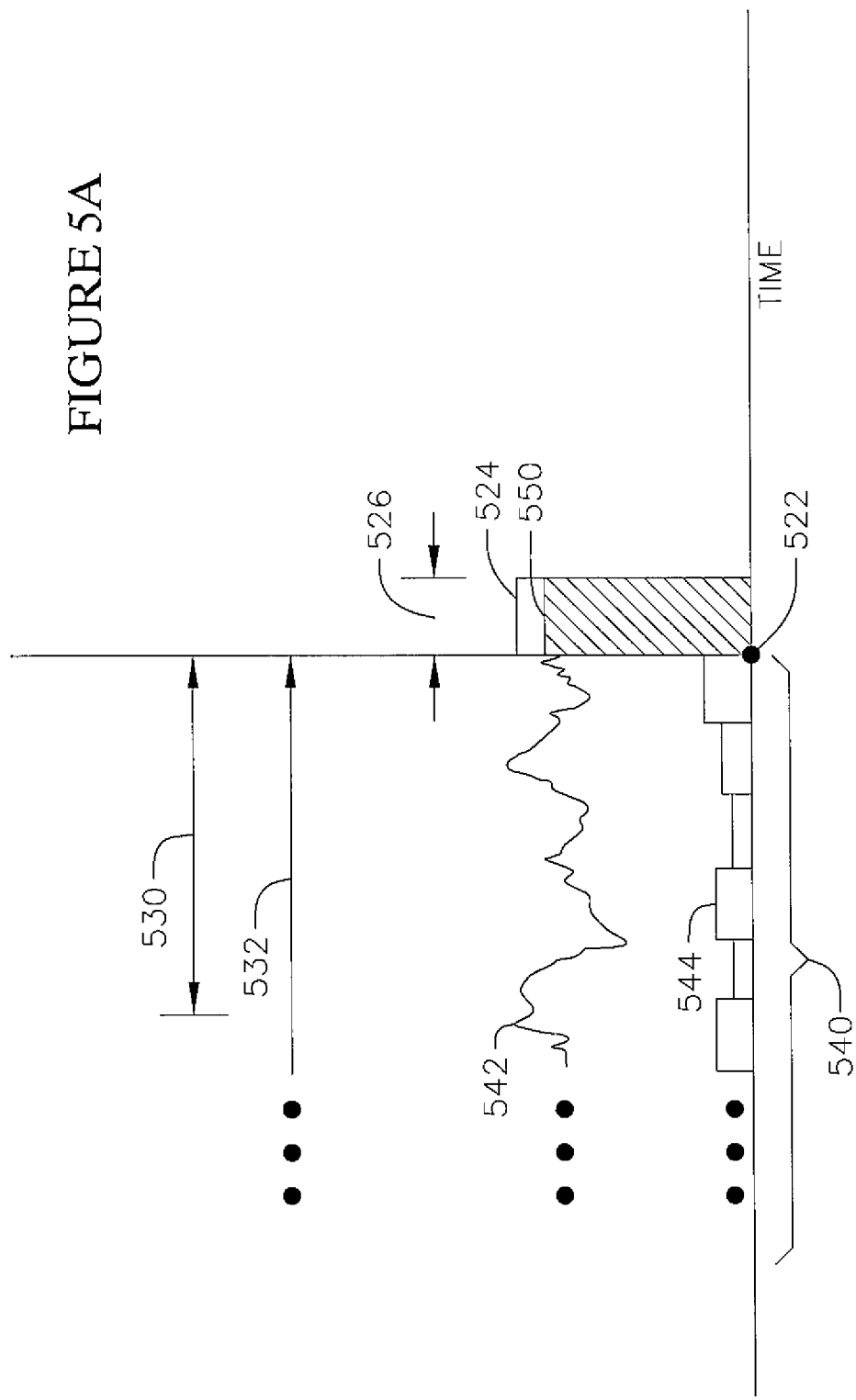

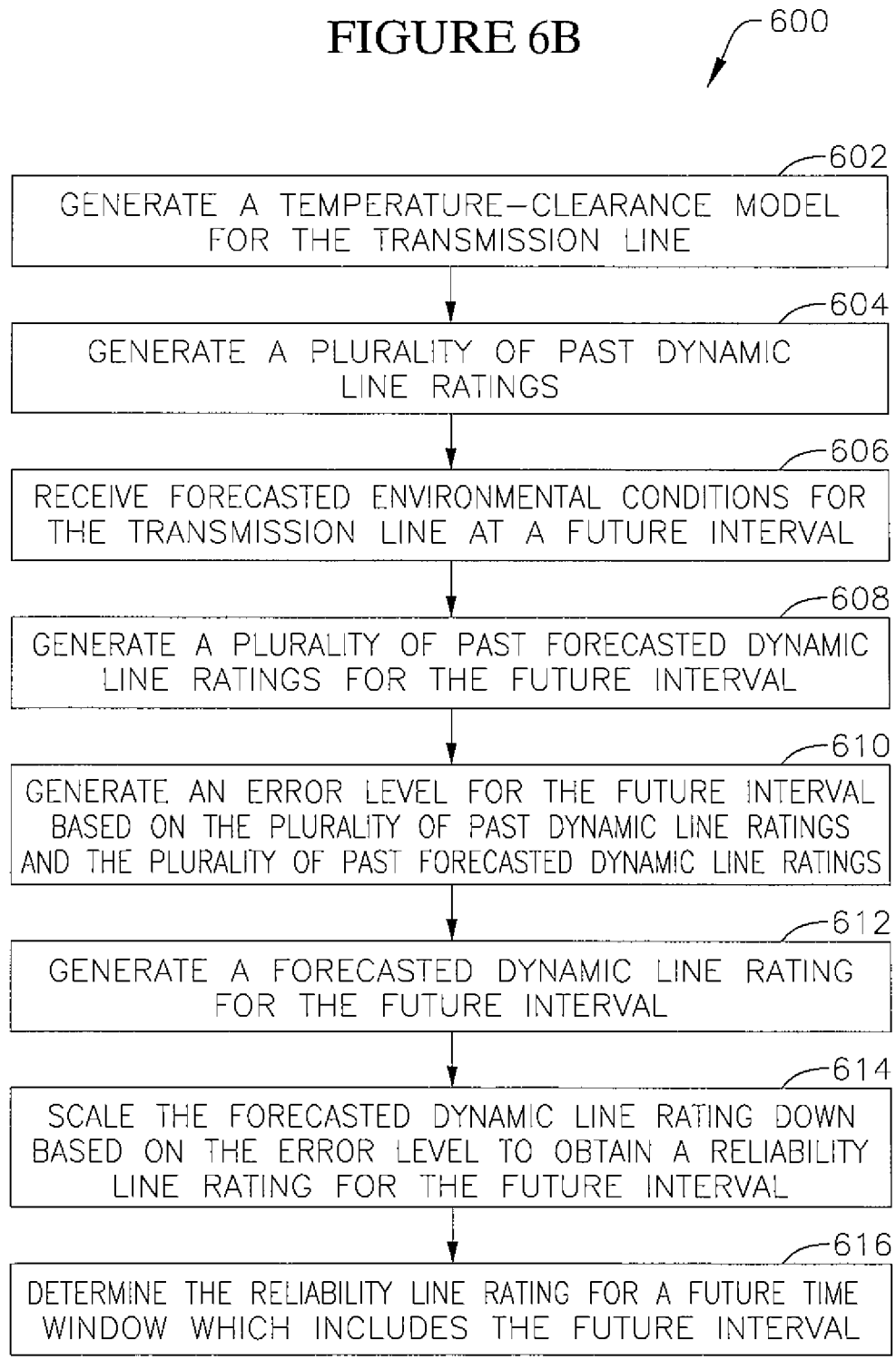

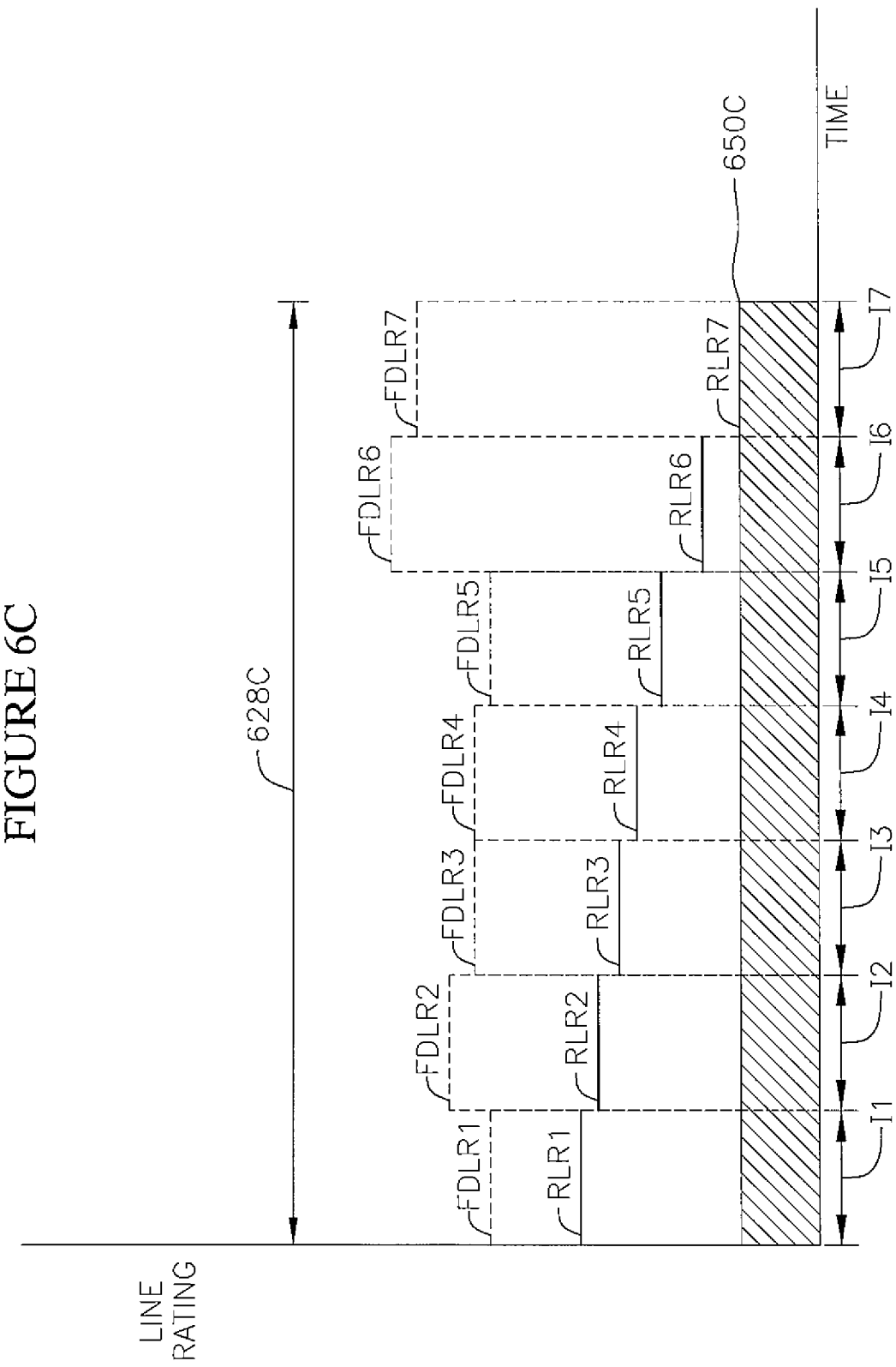

SYSTEM AND METHOD FOR GENERATING A TRANSMISSION LINE RELIABILITY RATING

BACKGROUND

The following Background discussion is only for enhancement of understanding of the background of the invention, and therefore it may contain information that does not form the prior art that is already known to a person of ordinary skill in the art. Utilities use transmission lines to carry current throughout the power grid. Transmission lines are often mounted high off the ground, such as between transmission line towers, in order to prevent the transmission lines from coming into contact with other objects. The length of a transmission line, and therefore the clearance between the transmission line and the ground, depends on the line temperature. If the transmission line drops too low, it may contact an object below, or present a safety hazard where it could be contacted by an object. The temperature of a transmission line depends on the current running through the transmission line and environmental variables such as solar radiation, ambient temperature, wind speed, wind azimuth, precipitation, and humidity. Running a larger current through a transmission line increases the temperature of that transmission line, reducing its clearance.

Static line ratings set a static maximum level of current that should be applied to a transmission line, based on that line's clearance, to prevent the clearance from dropping below an acceptable level. To account for the fact that environmental variables impact the temperature of a transmission line, static line ratings may assume poor environmental conditions—for example, that the transmission line is in direct sunlight on a hot day with little wind. Many times, however, a transmission line may be experiencing more favorable environmental conditions. In these circumstances, the transmission line could safely carry more current than suggested by the static line rating. Other times, such as on an exceptionally hot day, the environmental conditions may be even worse than assumed by the static line rating. In these circumstances, a transmission line carrying a current within the static line rating may actually drop below an acceptable clearance level, creating an unsafe situation without exceeding the static line rating. In order to improve the efficiency of the distribution and consumption of electrical power, there is a need in the art for a dynamic or balanced system and method for adjusting an amount of current carried though a transmission line. As many electric utility operational decisions are made not in real-time bur rather in advance, there is a need to forecast what the rating will be in the future.

SUMMARY

According to aspects of the present disclosure, a system and method for determining a reliability line rating for a transmission line during an interval of time are provided.

According to aspects of the present disclosure, a system and method for determining a reliability line rating for a transmission line during an interval are provided.

In one aspect of the present disclosure, a system for determining a reliability line rating for a transmission line during a present interval is provided. The system includes a line monitor on a transmission line. The line monitor includes a clearance sensor to determine a line clearance measurement, a line temperature sensor to determine a line temperature measurement, a line current sensor to determine a line electrical load, and a transmitter. The transmitter transmits the line clearance measurement and the line temperature measurement to a reliability determination module disposed on a remote utility server. In response to the line clearance measurement and the line temperature measurement, the reliability determination module generates a temperature-clearance model for the transmission line based on the received line clearance measurement and line temperature measurement. The reliability determination module generates a plurality of past dynamic line ratings and determines a scaling factor based on the plurality of past dynamic line ratings. The reliability determination module generates a present dynamic line rating at a start of a present interval, and scales the present dynamic line rating in response to the scaling factor to obtain a reliability line rating for the present interval.

In one embodiment, the clearance sensor is a LIDAR clearance sensor.

In one embodiment, the line monitor further includes one or more environmental condition sensors generating corresponding environmental condition measurements usable by the reliability determination module on the remote utility server to generate the dynamic line rating.

In one embodiment, the reliability determination module is configured to determine a mean value of the plurality of past dynamic line ratings, determine a cutoff value of the plurality of past dynamic line ratings, the cutoff value being based on a confidence level, and determine the scaling factor by dividing the cutoff value by the mean value.

In one embodiment, the reliability determination module is configured to multiply the present dynamic line rating by the scaling factor to obtain the reliability line rating for the present interval.

In one embodiment, the reliability determination module is configured to determine a plurality of error level values based on the plurality of past dynamic line ratings, and determine the scaling factor based on the plurality of error level values.

In one embodiment, the reliability determination module is further configured to display the reliability line rating for the present interval to a transmission line operator.

In one embodiment, the reliability determination module is further configured to limit a level of current that may be applied to the transmission line during the present interval to the reliability line rating for the present interval.

In another aspect of the present disclosure, system for determining a reliability line rating during a future time window for a transmission line is provided. The system includes a line monitor on a transmission line and a reliability determination module. The line monitor includes a clearance sensor to determine a line clearance measurement, a line temperature sensor to determine a line temperature measurement, and a line current sensor to determine a line electrical load. The reliability determination module is disposed on a remote utility server. The reliability determination module is configured to, in response to the line clearance measurement and the line temperature measurement, generate a temperature-clearance model for the transmission line based on the received line clearance measurement and line temperature measurement. The reliability determination module generates a plurality of past dynamic line ratings, receives forecasted environmental variables corresponding to a future interval, generates a plurality of past forecasted dynamic line ratings corresponding to the future interval, generates a plurality of error level values for the future interval based on the plurality of past forecasted dynamic line ratings and the plurality of past dynamic line ratings, generates a current forecasted dynamic line rating for the future interval, determines a scaling factor based on the plurality of error level values, and scales the current forecasted dynamic line rating in response to the scaling factor to obtain a reliability rating for the future interval.

In one embodiment, the clearance sensor is a LIDAR clearance sensor.

In one embodiment, the reliability determination module is configured to determine a mean value of the plurality of error level values, determine a cutoff value for the plurality of error level values, the cutoff value being based on a confidence level; and determine the scaling factor by dividing the cutoff value by the mean value.

In one embodiment, the reliability determination module is configured to multiply the current forecasted dynamic line rating by the scaling factor to obtain the reliability rating for the future interval.

In one embodiment, the reliability determination module is further configured to display the reliability line rating for the future time window to a transmission line operator.

In another aspect of the present disclosure, a system for determining that a clearance obstruction has occurred in an environment of a transmission line is provided. The system includes a line monitor on a transmission line comprising a clearance sensor to determine a line clearance measurement and a line temperature sensor to determine a line temperature measurement, and a reliability determination module. The reliability determination module is disposed on a remote utility server. The reliability determination module is configured to, in response to the line clearance measurement and the line temperature measurement, generate a temperature-clearance model for the transmission line based on the received line clearance measurement and line temperature measurement. The reliability determination module monitors the temperature-clearance model for a change in a temperature-clearance relationship, and determines that a clearance obstruction has occurred in an environment of the transmission line when the temperature-clearance relationship changes.

In one embodiment, the reliability determination module monitors the temperature-clearance model for the change in the temperature-clearance relationship by monitoring a value of a Y-intercept of the temperature-clearance model.

In one embodiment, the reliability determination module monitors the temperature-clearance model for the change in the temperature-clearance relationship by monitoring the slope of the temperature-clearance model.

In another aspect of the present disclosure, a system for determining a reliability line rating for a transmission line during an interval is provided. The system includes a processor and a memory. The memory has stored therein instructions that, when executed by the processor, cause the processor to, in response to a line clearance measurement and a line temperature measurement received from a transmission line monitor coupled to a transmission line, generate a temperature-clearance model for the transmission line based on the received line clearance measurement and line temperature measurement, generate a plurality of past dynamic line ratings, determine a scaling factor based on the plurality of past dynamic line ratings, generate a dynamic line rating for an interval, and scale the dynamic line rating in response to the scaling factor to obtain a reliability line rating for the interval.

In one embodiment, the dynamic line rating is a present dynamic line rating.

In one embodiment, the instructions further cause the processor to, in response to a plurality of environmental condition measurements received from the transmission line monitor, generate the present dynamic line rating.

In one embodiment, the interval is a future interval and the dynamic line rating is a future dynamic line rating, and wherein the instructions further cause the processor to, in response to forecasted environmental variables for the future interval, generate a plurality of past forecasted dynamic line ratings corresponding to the future interval, generate a plurality of error level values for the future interval based on the plurality of past forecasted dynamic line ratings and the plurality of past dynamic line ratings, in response to forecasted environmental variables for the future interval, generate a present forecasted line rating for the future interval, and determine the scaling factor based on the plurality of error level values.

These and other features, aspects and advantages of the present invention will be more fully understood when considered with respect to the following detailed description, appended claims, and accompanying drawings.

BRIEF DESCRIPTION OF THE DRAWINGS

The accompanying drawings, together with the specification, illustrate preferred and example embodiments of the present invention, and, together with the description, serve to explain the principles of the present invention.

FIG. 4 is a graph depicting a temperature-clearance model for a transmission line according to embodiments of the present disclosure.

FIG. 5A is a diagram showing line ratings over time, including a reliability line rating for a present interval.

FIG. 6B is a flow chart showing a method for generating a reliability rating for a future time window according to embodiments of the present disclosure.

FIG. 6C is a diagram showing a plurality of reliability line ratings for a plurality of future intervals according to embodiments of the present disclosure.

DETAILED DESCRIPTION OF THE PREFERRED EMBODIMENTS

Figure 1:
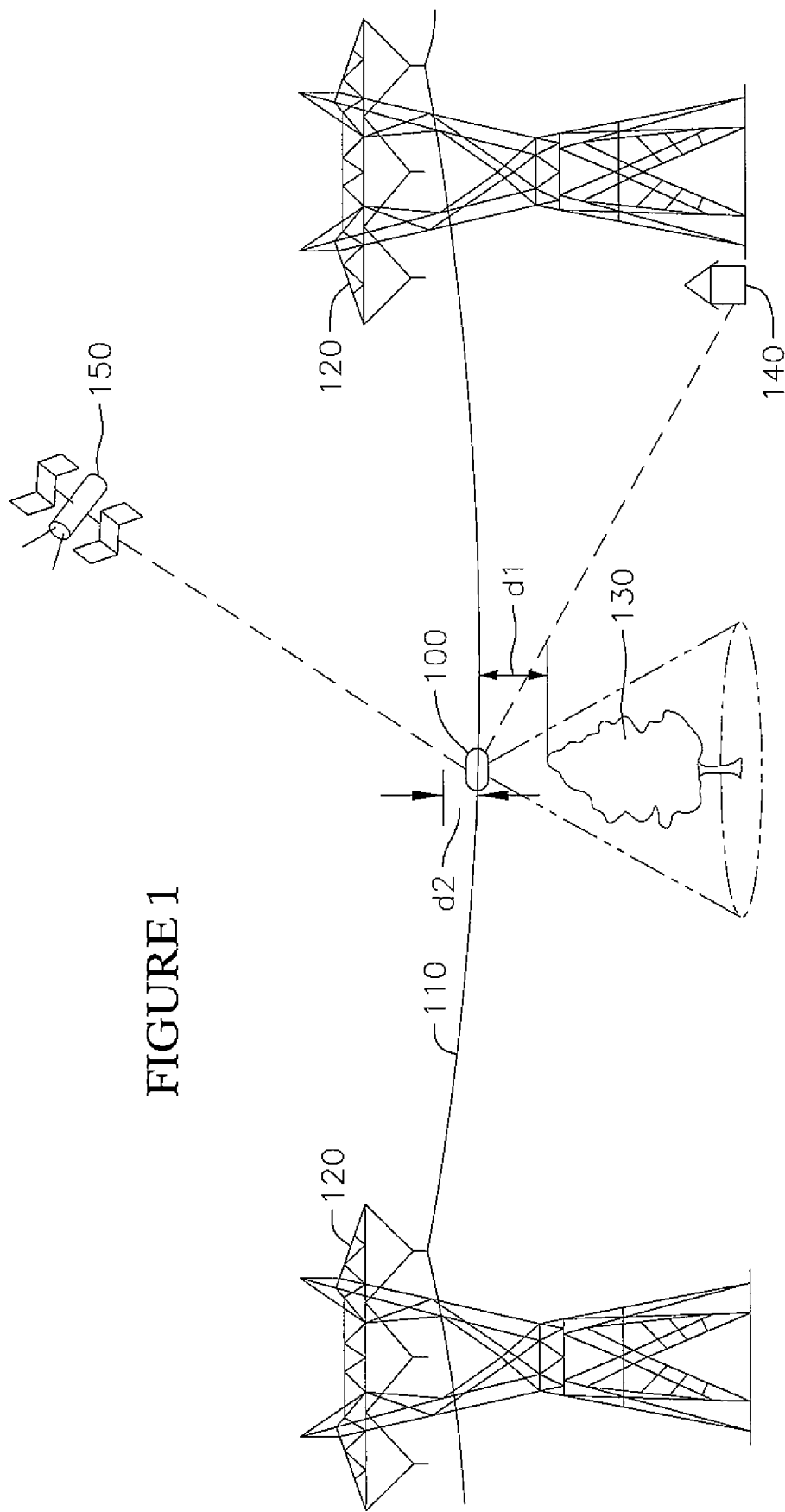
FIG. 1 is a schematic diagram showing a transmission line monitor on a transmission line according to embodiments of the present disclosure.

In the following detailed description, only certain preferred and example embodiments of the present invention are shown and described, by way of illustration. As those skilled in the art would recognize, the invention may be embodied in many different forms and should not be construed as being limited to the embodiments set forth herein. Descriptions of features or aspects within each example embodiment should typically be considered as available for other similar features or aspects in other example embodiments. Like reference numerals designate like elements throughout the specification.

In general terms, embodiments of the present disclosure are directed to a system and method for reliably anticipating what the current capacity of a transmission line will be during a given period in the future. The transmission line may have a minimum acceptable clearance. The clearance of the transmission line may depend on the temperature of the transmission line, and the temperature of the transmission line may depend on the current flowing in the transmission line. Accordingly, the transmission line's maximum capacity for carrying current may be defined in part by the minimum acceptable clearance of the transmission line.

A line operator may set the level of current flowing through a transmission line. At any given time, the maximum current that the transmission line can handle may depend on environmental conditions such as the ambient temperature at the transmission line, the wind on the transmission line, or the solar radiation on the transmission line, and therefore can change unpredictably. The system and method of the present disclosure may provide the operator with a reliability line rating. The reliability line rating identifies a current level that the operator may reliably apply to the transmission line without exceeding the instantaneous maximum line current, regardless of variations therein.

FIG. 1 is a schematic diagram showing a transmission line monitor 100 on a transmission line 110 according to embodiments of the present disclosure. The transmission line monitor 100 may be coupled to a transmission line 110 to gather information about the transmission line 110. In some embodiments, the transmission line monitor 100 may be coupled to a critical span of the transmission line. A span is a length of the transmission line 110 extending between two attachment points, such as transmission line towers 120. A span may be critical when it is expected that it might be the first span in the line to have a clearance violation when increasing operating current. This can be based on the height of the span (spans with lower clearance will have clearance violations earlier), the length of the span (longer spans lose more clearance for a given line temperature change), or the span's exposure to environmental variables (e.g. a span exposed to direct sunlight or that is protected from the wind will have a higher line temperature for a given current than a span that is protected from the sun or exposed to wind). In some embodiments, transmission line monitors 100 may be coupled to multiple spans in a transmission line, for example at multiple critical spans or at regular intervals along the transmission line.

Figure 2:
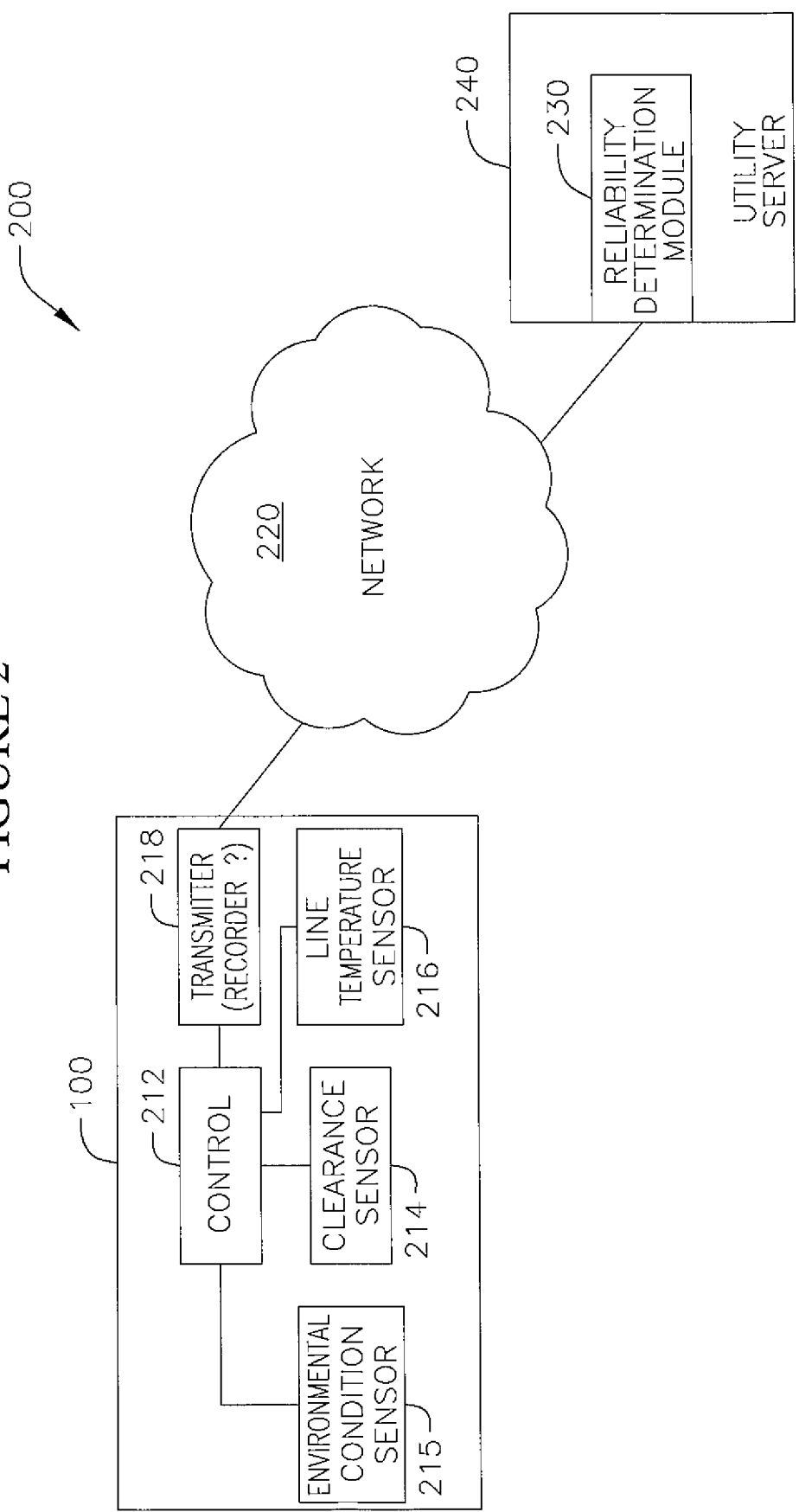
FIG. 2 is a block diagram of a system for determining a reliability current rating for a transmission line according to embodiments of the present disclosure.

FIG. 2 is a block diagram of a system 200 for determining a reliability current rating for a transmission line according to a preferred embodiment of the present disclosure. The preferred system 200 may include a transmission line monitor 100 and a reliability determination module 230 that is disposed on a remote utility server 240. In alternative embodiments, the reliability determination module 230 can be integral with the transmission line monitor 100. In still other alternative embodiments, the reliability determination module 230 can be a unitary module disposed on a single utility server 240; multiple iterations or instantiations of a single module disposed on more than one utility server 240; or at least partially disposed on a distinct server from the utility server 240, such as for example on a cloud based system known to those of skill in the art of scalable computing.

Preferably, the transmission line monitor 100 may include a clearance sensor 214. The clearance sensor 214 preferably functions to determine the present clearance of the span of the transmission line 110 and generate a line clearance measurement. In some embodiments, the clearance sensor 214 directly measures clearance d1 shown in FIG. 1. For example, the transmission line monitor 100 and/or the clearance sensor 214 may be mounted on the transmission line 110 and may measure the distance between the clearance sensor 214 and the closest object below 130. In some embodiments, the clearance sensor 214 can include a LIDAR subsystem to measure clearance between the clearance sensor 214 and the closest object below 130. Alternatively, the clearance sensor 214 can include any other range finding system or subsystem, including sonar, radar, optical, image-based, or any suitable combination thereof. An example of a transmission line monitor including a clearance sensor is described in international patent application publication number WO 2014/165217 A2, the entire content of which is incorporated herein by reference.

In other embodiments, the clearance sensor 214 may measure the sag d2 of the span of the transmission line, as shown in FIG. 1, in lieu of or in addition to measuring the clearance d1. The sag d2 may be used to calculate the clearance d1 or may be used in place of or as a ratification of the measurement of the clearance d1. In other embodiments, the clearance sensor 214 may not be physically attached to the transmission line 110, and may measure the sag and/or clearance of the transmission line 110 from a distance.

As shown in FIG. 2, a preferred transmission line monitor 100 may also include a line temperature sensor 216. The line temperature sensor 216 preferably functions to determine the present temperature of the transmission line 110 and generate a line temperature measurement. The line temperature sensor may directly measure the temperature of the transmission line 110. In some embodiments, the line temperature sensor is a thermocouple. In other embodiments, the line temperature sensor is an infrared temperature measuring device.

In other embodiments, the line temperature sensor 216 may measure the current on the transmission line 110 and the environmental conditions that impact the temperature of the transmission line 110, and the transmission line temperature may be calculated based these measurements, for example using IEEE Standard 738. The calculation may be performed by the controller 212, or the measurements may be transmitted to a utility server 240 and the calculation of the line temperature may be performed at the utility server 240 by the reliability determination module 230. In other embodiments, the line temperature sensor 216 may measure the environmental conditions and/or other variables that impact the temperature of the transmission line 110 as the line temperature measurement instead of directly measuring or calculating the line temperature.

The preferred transmission line monitor 100 may also include one or more environmental condition sensors 215. The environmental condition sensors 215 preferably function to measure conditions at the transmission line 110 that may impact the temperature of the transmission line other than the current flowing in the transmission line 110. For example, the one or more environmental condition sensors 215 may include an ambient temperature (ground temperature) sensor.

As shown in FIG. 2, the preferred transmission line monitor 100 may include a controller 212 and a communication circuit 218. The controller 212 may be configured to receive the line clearance measurement and the line temperature measurement and communicate them to the communication circuit 218. In some embodiments, the communication circuit 218 may receive the line clearance measurement and the line temperature measurement directly from the clearance sensor 214 and the line temperature sensor 216, respectively, and the controller 212 may be omitted from the transmission line monitor 100.

Preferably, the communication circuit 218 may include a transmitter and/or a receiver. The communication circuit 218 may transmit the line clearance measurement and the line temperature measurement to the utility server 240. In some embodiments, the communication circuit 218 communicates with the utility server 240 through a network 220. Various embodiments for the network 220 are possible. In some embodiments, the communication circuit 218 may initially communicate with a satellite or satellite network 150 as part of the network 220. In other embodiments, the communication circuit 218 may initially communicate with a cellular telephone network as part of network 220. In other embodiments shown in FIG. 1, the communication circuit 218 may initially communicate wirelessly with a nearby receiver 140 that is coupled to network 220. After the initial communication step, the network may be any number of communication networks that will be apparent to those of ordinary skill in the art. In some embodiments, the network 220 is a wide area network such as the Internet. In other alternative embodiments, the controller 212 and the communication circuit 218 can be integrated into a single component that provides on board data processing as well as communications thereof to at least the remote utility server 240.

Figure 3:
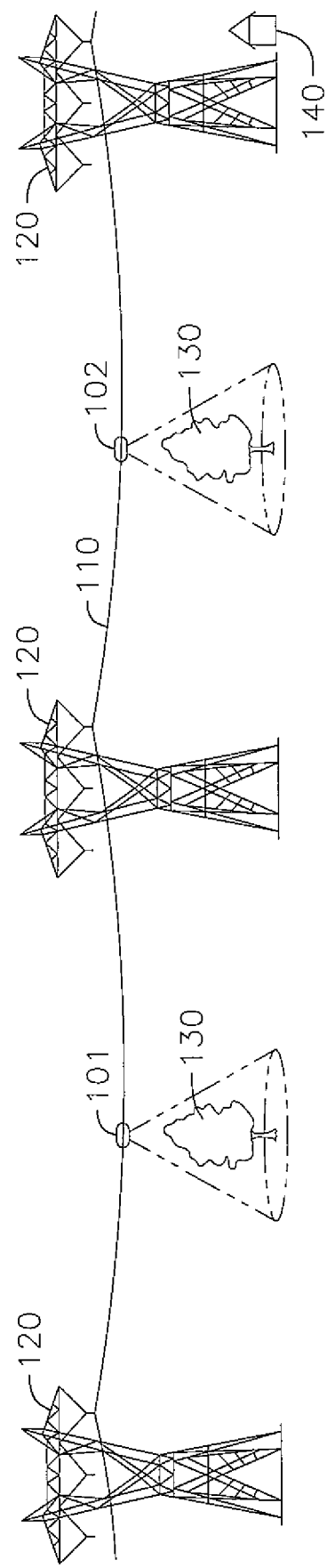
FIG. 3 is a schematic diagram showing multiple transmission line monitors on a transmission line according to embodiments of the present disclosure.

As shown in FIG. 3, in an alternative preferred embodiment a first transmission line monitor 101 and a second transmission line monitor 102 are coupled to a transmission line 110 at different spans. The first transmission line monitor 101 may initially communicate with the second transmission line monitor 102. The second transmission line monitor 102 may then communicate wirelessly with a nearby receiver 140 or may otherwise communicate through a network to a remote utility server 240. In this manner, a number of transmission line monitors may communicate with one another to form a mesh network capable of connecting any transmission line monitor in the network to one or more utility servers 240 thereby extending the range over which the first transmission line monitor 101 may communicate with the receiver 140 and adding redundancy and reliability to the distribution system.

In another preferred embodiment of the system 200, the reliability determination module 230 can generate a temperature-clearance model for the transmission line. For example, FIG. 4 is a graph depicting a notional temperature-clearance model 404 for a transmission line according to embodiments of the present disclosure.

A transmission line may lengthen with increased temperature. Accordingly, the clearance of a transmission line may depend on the temperature of the transmission line. The temperature-clearance model 404 may be a statistical model which can show or predict the clearance of the transmission line for a given line temperature. The temperature-clearance model 404 may be generated based on the clearance measurements and line temperature measurements 402 received from the transmission line monitor 100 over time. Clearance values may be compared to the line temperatures at which they were measured to determine the relationship between clearance and line temperature for the transmission line. By comparing multiple clearance values having multiple corresponding line temperatures, a best-fit statistical model (e.g., a linear model) may be determined. This best-fit statistical model may be used as the temperature-clearance model 404.

In some embodiments, the reliability determination module 230 may generate the temperature-clearance model 404 using linear regression. Linear regression may allow the temperature-clearance 404 model to accurately reflect transmission line behavior outside the ranges in that the clearance and line temperature were actually measured.

In some embodiments, the temperature-clearance model 404 may be regularly or continuously updated to be based on the most recent line temperature measurements and line clearance measurements 402. The transmission line monitor 100 may gather a specified number of measurements 402 before the reliability determination module 230 generates the temperature-clearance model 404. For example, the temperature-clearance model 404 may be generated every 6 hours based on the measurements 402 gathered during the previous 72 hours. In other embodiments, the interval between updates of the temperature-clearance model 404 can be variable, manual, seasonal, or continuously with streaming and/or near real time temperature information being received at the reliability determination module 230.

In some embodiments, the temperature-clearance model 404 may be a statistical model which can show or predict the clearance of the transmission line for a given set of environmental variables. For example, the temperature-clearance model 404 may directly model the relationship between environmental conditions impacting line temperature and the clearance of the transmission line.

In some embodiments, the temperature-clearance model 404 may use a back-calculated effective-ambient temperature in modeling the relationship between line temperature and clearance. Instead of using a direct ambient temperature measurement, the transmission line monitor 100 or the reliability determination module 230 may utilize an equation for calculating transmission line temperature which includes ambient temperature as a variable (e.g. IEEE Standard 738). It may receive values or measurements for all of the other variables in the equation, and calculate the ambient temperature based on those values, utilizing the calculated value as the effective-ambient temperature. The effective-ambient temperature may then be used in generating the temperature-clearance model 404.

In some preferred embodiments, the reliability determination module 230 monitors the temperature-clearance model 404 for changes. For example, the reliability determination module 230 may record and monitor the Y-intercept of the temperature-clearance model 404 for changes. In other embodiments, the reliability determination module 230 may record and monitor the slope of the temperature-clearance model 404. Because the temperature-clearance model 404 is an approximation or extrapolation based on a limited set of data, a degree of variation may be expected. Significant changes, outside the expected degree of variation, may indicate that something in the environment of the transmission line has changed. For example, a significant change in the temperature-clearance model 404 may indicate that a change in the environment beneath the transmission line (foliage growths out to be beneath transmission line, large object placed beneath line), or that the transmission line conductor properties have changed due to a heavy mechanical load (ice) or due to overheating. In some embodiments, the reliability determination module 230 may alert an operator when significant changes in the temperature-clearance model 404 are detected.

In normal operation of the preferred system 200, the transmission line 110 may have a minimum acceptable clearance 406. The minimum acceptable clearance 406 for the transmission line 110 may be compared to the temperature-clearance model 404 for the transmission line 110 to find a maximum allowable line temperature 408 for the transmission line 110, at which the transmission line 110 will no longer meet the minimum acceptable clearance 406. The line temperature of the transmission line 110 may depend on the current in the transmission line 110 and environmental conditions at the transmission line such as the ambient temperature at the transmission line 110, the wind on the transmission line 110, or the solar radiation on the transmission line 110.

A dynamic line rating (hereinafter 'DLR') for a transmission line 110, at a given moment, may be the amount of current that an operator may run through a transmission line 110 at that moment without exceeding the maximum line temperature 408 for the transmission line 110. Because the line temperature is based on both current and environmental conditions, the DLR of a transmission line 110 can vary over time based on changes in environmental conditions. A discussion of calculating the DLR of a transmission line can be found in U.S. Pat. No. 9,519,014, the entire content of which is incorporated herein by reference.

FIG. 5A is a diagram showing line ratings over time, including a reliability line rating 550 for a present interval 526.

The initial DLR for an interval may be the DLR at the beginning of the interval. Accordingly, the initial dynamic line rating 524 for the present interval 526 may be the dynamic line rating at the present time 522.

As used herein, an interval may be a period of time of a particular duration. Time may be represented as a series of consecutive intervals. In some embodiments, each interval may be one hour long. The present interval 526 may be the interval beginning at the present time 522.

As discussed above, a transmission line 110 may have an instantaneous maximum current (or DLR) that varies over time. The reliability line rating 550 for the present interval 526 may be a level of current that the transmission line 110 may reliably carry for the duration of the present interval 526 without exceeding the DLR, regardless of variations therein (and/or without dropping below the minimum acceptable clearance or exceeding the conductor maximum line temperature).

Preferably, a DLR record 540 may be a set of values that are related to or based on past values of the transmission line DLR. In some alternative embodiments, the DLR record 540 may simply be the past plurality of DLR values 542. In other alternative embodiments, the DLR record 540 may include error level values 544. An error level may correspond to a past interval during which the DLR was generated at multiple times, including at the beginning of the interval ("the initial DLR"). The error level may be a value which represents and/or is based on the difference between the initial DLR and the DLRs generated during the past interval.

Figure 5B:
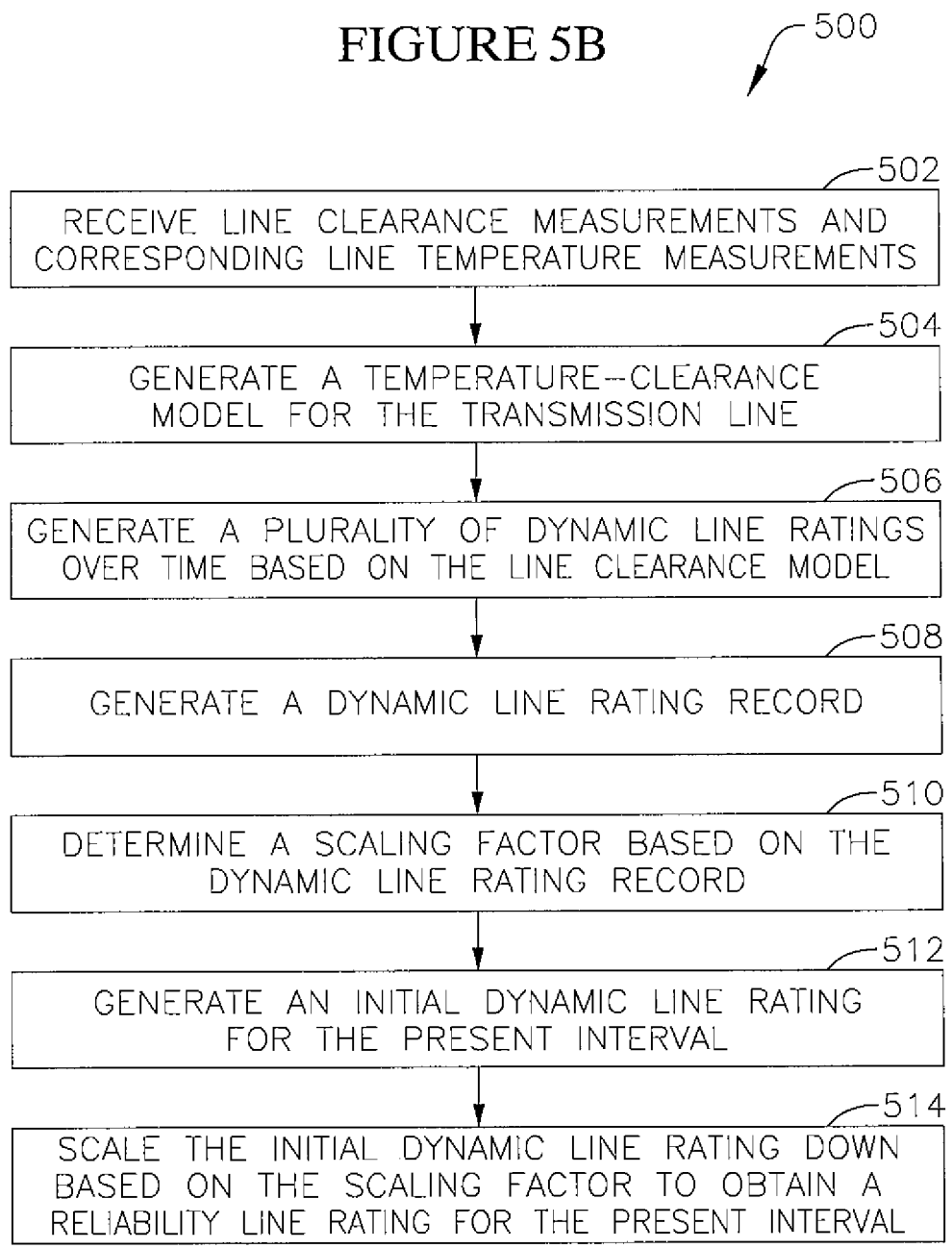
FIG. 5B is a flow chart showing a method for generating a reliability line rating for a present interval according to embodiments of the present disclosure.

FIG. 5B is a flow chart showing a method 500 for generating a reliability line rating 550 for a present interval 526 according to a preferred embodiment of the present disclosure. Referring to FIG. 5B, at block 502, the reliability determination module 230 preferably receives line clearance measurements and corresponding line temperature measurements for an interval. The line clearance measurements and the line temperature measurements may be received from a transmission line monitor 100. At block 504, the reliability determination module 230 preferably generates a temperature-clearance model for a transmission line. The temperature-clearance model may be generated based on past line clearance measurements and line temperature measurements. In some embodiments, the temperature-clearance model is generated as described above in reference to FIG. 4.

At block 506, the reliability determination module 230 preferably generates a plurality of DLRs over time. In some alternative embodiments, the dynamic line ratings may be based on the temperature-clearance model. The generated dynamic line ratings may be a plurality of past dynamic line ratings 542. In generating a DLR, the utility server 240 may receive environmental condition measurements. In other alternative embodiments, these measurements may be gathered by the transmission line monitor 100 and transmitted to the reliability determination module 230. In other embodiments, these measurements are gathered by remote sensors not coupled to the transmission line monitor 100. For example, the remote sensors may be located at a transmission line tower or at a power substation. In other embodiments, the environmental condition measurements are received from third-party services that record and/or forecast environmental conditions on a large scale, such as the National Oceanic and Atmospheric Administration (NOAA) or a forecast aggregating service.

Once the environmental conditions at the transmission line are known, the reliability determination module 230 preferably determines what level of current would result in the transmission line reaching the maximum line temperature; this level of current may be the DLR of the transmission line at that time. In some embodiments, the utility server may make this determination by putting the environmental condition measurements into a formula for transmission line temperature, and solving for the current level. In some embodiments, the formula is IEEE Standard 738, the entire content of which is incorporated herein by reference.

In other alternative embodiments, the reliability determination module 230 determines the DLR using a model generated based on past values of the environmental condition measurements and line temperature measurements. The reliability determination module 230 preferably generates a model that models the relationship between transmission line temperature and the environmental conditions. In some embodiments, this model may be generated using machine learning techniques. The reliability determination module 230 preferably uses the model to determine the level of current that would result in the maximum transmission line temperature, given the currently measured environmental conditions. In other alternative embodiments, a transmission line monitor 100 may calculate the DLR for the transmission line and a reliability determination module 230 may receive the DLR from the transmission line monitor 100. For example, a controller 212 may calculate the DLR, and the communication circuit 218 may transmit the DLR to the reliability determination module 230.

At block 508, the reliability determination module 230 preferably generates a DLR record 540. The DLR record values may be based on the plurality of past DLR values 542 generated at block 506. In some embodiments, the DLR record 540 may simply be the plurality of past DLR values 542 generated at block 506. In other alternative embodiments, the DLR record values may be error levels 544. In some embodiments, the error level 544 for an interval may be the difference between the initial DLR and the average value of the DLRs generated during the interval. In other embodiments, the error level for an interval may be the difference between the initial DLR and the lowest DLR generated during the interval.

At block 510, the reliability determination module 230 preferably determines a scaling factor based on the DLR record 540 and a confidence level. The confidence level may be a percentage. In some embodiments, the scaling factor may be a constant with a value less than 1 which, when multiplied by the mean value for the DLR record values, results in a cutoff value that a percentage of DLR record values equal to the confidence level will be above. For example, a confidence level may be 98%. The cutoff value will be the value of the second percentile of the DLR record values—a value that 98% of the DLR record values will be above. The scaling factor will be a constant which, when multiplied by the mean of the DLR record values, equals the cutoff value.

In some alternative embodiments, the scaling factor may be generated based on all past DLR record values for the transmission line. In other embodiments, the scaling factor may be generated based on the DLR record values from a past time window. For example, the scaling factor may be generated based on the DLR record values recorded in the last 48 hours. In other alternative embodiments, the scaling factor may be generated based on DLR record values from a first past time window 530 and a second past time window 532 including different times. In some embodiments, the time windows 530 and 532 may be different lengths. In some embodiments, the time windows 530 and 532 may overlap. For example, the first time window 530 can be the last 24 hours, and the second time window 532 can be the last 48 hours. A first intermediate scaling factor may be generated for the first past time window 530 based on the DLR record values in the first window 530, and a second intermediate scaling factor may be generated for the second past time window 532 based on the DLR record values in the second window 532. The first intermediate scaling factor and the second intermediate scaling factor may be averaged to generate the scaling factor. In some embodiments, the first intermediate scaling factor and the second intermediate scaling factor may be given different weights in creating the scaling factor. The weights may vary based on prevailing circumstances; for example, a more recent time window may be given a higher weight when a storm is forecasted, thereby giving greater weight to recent DLR record values, causing the scaling factor to adjust to changing circumstances after a shorter delay.

At block 512, the reliability determination module 230 preferably generates an initial DLR 524 for the present interval 526. The initial DLR 524 for the present interval 526 may be generated as described above in reference to block 506. In other embodiments, the initial DLR 524 for the present interval 526 may be generated by the transmission line monitor 100 and transmitted to the utility server 240.

At block 514, the reliability determination module 230 preferably scales the initial DLR 524 for the present interval 526 down based on the scaling factor determined at block 510. For example, the initial DLR 524 for the present interval 526 may be multiplied by the scaling factor. The resulting value may be the reliability line rating 550 for the transmission line for the present interval 526. The reliability determination module 230 may communicate the reliability line rating 550 to a transmission line operator, for example through a display coupled to the reliability determination module 230, so that the transmission line operator may utilize the reliability line rating 550 in setting the level of current on the transmission line. In some embodiments, the utility server 240 is coupled to the system controlling the level of current on the transmission line, such as an energy management system, and the reliability determination module 230 limits the level of current that the system can apply based on the reliability line rating 550. In some embodiments, the reliability determination module 230 may determine reliability line ratings for multiple spans on a single transmission line. It may then determine the lowest of the reliability line ratings for the various spans and utilize it as the reliability line rating for the entire transmission line. The reliability determination module 230 may display the reliability line rating for the entire transmission line to a transmission line operator, or may limit the level of current on the transmission line (for example through an energy management system) based on the reliability line rating for the entire transmission line.

The description above of the method 500 depicted in FIG. 5B includes references to the system of FIG. 2. In some embodiments, the method 500 of FIG. 5B is performed by the reliability determination module 230 of FIG. 2. However, in other embodiments, the method 500 of FIG. 5B, as described above, is not performed by the system of FIG. 2, and accordingly the disclosure above should not be limited thereto.

Figure 6A:
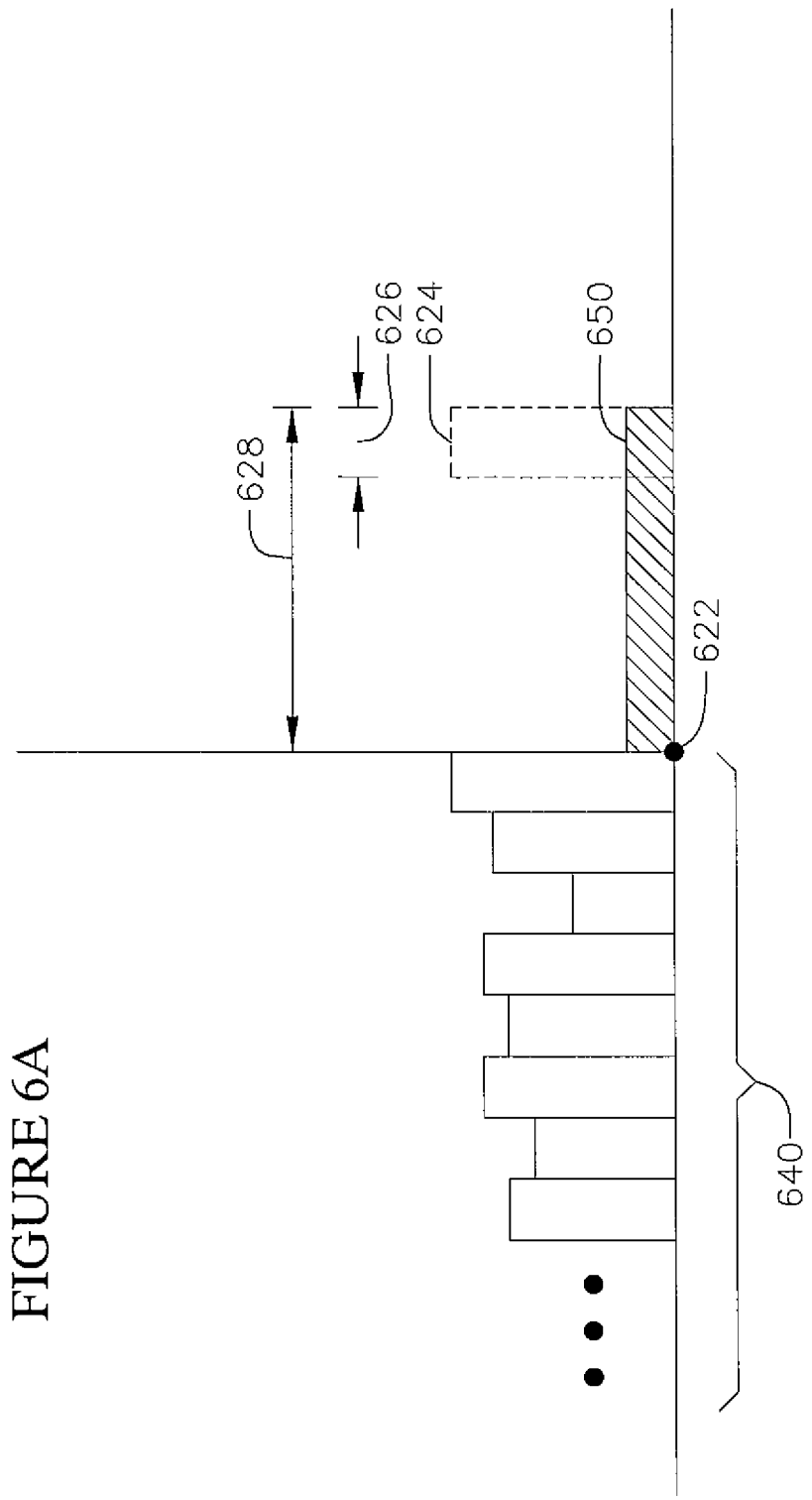
FIG. 6A is a diagram showing line ratings over time, including a reliability line rating for a future time window, according to embodiments of the present disclosure.

FIG. 6A is a diagram showing line ratings over time, including a reliability line rating 650 for a future time window 628.

A reliability line rating 650 for a future time window 628 may be a level of current that the transmission line may reliably carry for the duration of the future time window 628 without exceeding the DLR, regardless of variations therein (and/or without dropping below the minimum acceptable clearance or exceeding the maximum line temperature). A reliability line rating 650 for a future time window 628 may be based on a forecasted DLR 624 (hereinafter "FDLR") for a future interval 626. A future interval 626 may be a period of time occurring a set amount of time from the present time 622. The future interval 626 may be within the future time window 628. A FDLR 624 for a future interval 626 may be what the DLR of the transmission line would be if the environmental conditions at the transmission line were the environmental conditions forecasted for the future interval 626. For example, FDLR(6) may represent FDLRs 624 generated based on forecasts of environmental conditions 6 hours from the time of forecasting (i.e. present time 622).

Error level values 640 may correspond to past FDLRs 624 for the interval 626 (e.g. past FDLRs 624 generated based on forecasts the same amount of time in the future). An error level may be a value that represents and/or is based on the difference between the generated FDLR 624 and the actual DLR as generated at the corresponding later time.

FIG. 6B is a flow chart showing a method 600 for generating a reliability rating for a future time window according to another preferred embodiment of the present disclosure.

Block 602 recites the reliability determination module 230 preferably generates a temperature-clearance model. The reliability determination module 230 may receive a line clearance measurement and a line temperature measurement for an interval. The line clearance measurement and the line temperature measurement may be received from a transmission line monitor 100. The temperature-clearance model may be generated based on past line clearance measurements and line temperature measurements. In some embodiments, the temperature-clearance model is generated as described above in reference to FIG. 4.

As shown in FIG. 6B, block 604 recites that the reliability determination module 230 may generate a plurality of past DLR ratings. The reliability determination module 230 may generate a plurality of DLRs over time. In some embodiments, the DLRs may be based on the temperature-clearance model generated at block 602. In generating a DLR, the reliability determination module 230 may receive environmental condition measurements. In some embodiments, these measurements may be gathered by the transmission line monitor 100 and transmitted to the reliability determination module 230. In other embodiments, these measurements are gathered by remote sensors not coupled to the transmission line monitor 100. For example, the remote sensors may be located at a transmission line tower or at a power substation. In other embodiments, the environmental condition measurements are received from third-party services that record and/or forecast environmental conditions on a large scale, such as NOAA.

Once the environmental conditions at the transmission line are known, the reliability determination module 230 may determine what level of current would result in the transmission line reaching the maximum line temperature; this level of current may be the DLR of the transmission line at that time. In some embodiments, the utility server may make this determination by putting the environmental condition measurements into a formula for transmission line temperature, and solving for the current level. In some embodiments, the formula is IEEE Standard 738.

In other embodiments, the reliability determination module 230 determines the DLR using a model generated based on past values of the environmental condition measurements and line temperature measurements. The reliability determination module 230 preferably generates a model that models the relationship between transmission line temperature and the environmental conditions. In some embodiments, this model may be generated using machine learning techniques. The reliability determination module 230 may use the model to determine the level of current that would result in the maximum transmission line temperature, given the currently measured environmental conditions.

In other embodiments, a transmission line monitor 100 may calculate the DLR for the transmission line and a reliability determination module 230 may receive the DLR from the transmission line monitor 100. For example, a controller 212 may calculate the DLR, and the communication circuit 218 may transmit the DLR to the reliability determination module 230.

As shown in FIG. 6B block 606 recites that the reliability determination module 230 preferably receives forecasted environmental conditions for the future interval 626. The forecasted measurements may be received from a third-party service that records and forecasts environmental conditions on a large scale, such as NOAA, or a forecast aggregating service. Alternatively, the forecasted measurements may be generated based on measurements received from forecasting equipment such as a barometer.

As shown in FIG. 6B, block 608 recites that the reliability determination module 230 preferably generates a plurality of past FDLRs corresponding to the future interval 626. For example, the utility server 240 may generate a plurality of FDLRs generated in the past based on environmental conditions forecasted 6 hours out. The reliability determination module 230 may generate a FDLR by putting the forecasted values of the environmental conditions into a formula for transmission line temperature, and solving for the current level. In some embodiments, the formula may be IEEE Standard 738.

In other alternative embodiments, the reliability determination module 230 generates the FDLR by comparing the forecasted environmental conditions to a model generated based on past values of the environmental condition measurements and line temperature measurements. The reliability determination module 230 may generate a model that models the relationship between transmission line temperature and the environmental conditions. In some embodiments, this model may be generated using machine learning techniques. The reliability determination module 230 may use the model to generate the FDLR by determining the level of current that would result in the maximum transmission line temperature, given the forecasted values of the environmental conditions.

As shown in FIG. 6B, block 610 recites that the reliability determination module 230 preferably generates one or more error level values 640 corresponding to past FDLRs for the future interval 626. The error level values 640 may be generated based on the plurality of past FDLRs and the plurality of past DLRs. The error level value 640 for a given past FDLR may be the difference between the past FDLR and the average value of the actual DLRs generated at the corresponding time. In other embodiments, the error level value 640 for a past FDLR may be the difference between the past FDLR and the lowest actual DLR generated at the corresponding time.

As shown in FIG. 6B, block 612 recites that the reliability determination module 230 preferably generates a FDLR 624 for the future interval 626. The forecasted FDLR 624 for the future interval 626 may be generated by putting the values of the environmental conditions forecasted at the future interval 626 into a formula for transmission line temperature, and solving for the current level. In some embodiments, the formula may be IEEE Standard 738. In other alternative embodiments, the FDLR 624 for the future interval 626 may be generated by comparing the values of the environmental conditions forecasted at the future interval 626 to a model generated based on past values of the environmental condition measurements and line temperature measurements. The reliability determination module 230 may generate a model that models the relationship between transmission line temperature and the environmental conditions. In some embodiments, this model may be generated using machine learning techniques. The reliability determination module 230 may use the model to generate the FDLR by determining the level of current that would result in the maximum transmission line temperature, given the forecasted values of the environmental conditions.

As shown in FIG. 6B, block 614 recites that the reliability determination module 230 preferably scales the FDLR 624 for the future interval 626 down. The reliability determination module 230 may determine a scaling factor based on the error level values 640 and a confidence level. The confidence level may be a percentage. In some alternative embodiments, the scaling factor may be a constant with a value less than 1 which, when multiplied by the mean value of the error level values 640, results in a cutoff value that a percentage of error level values 640 equal to the confidence level will be above. For example, a confidence level may be 98%. The cutoff value will be the value of the second percentile of the error level values 640—a value that 98% of the error level values 640 will be above. The scaling factor will be a constant that, when multiplied by the mean of the error level values 640, equals the cutoff value. The reliability determination module 230 preferably scales the FDLR 624 for the future interval 626 down based on the scaling factor. For example, the FDLR 624 for the future interval 626 may be multiplied by the scaling factor. The resulting value may be the reliability line rating for the transmission line for the future interval 626.

As shown in FIG. 6B, block 616 recites that the reliability determination module 230 may determine the reliability line rating 650 for the future time window 628. The reliability line rating 650 for the future time window 628 may be based on the reliability line rating for the future interval 626. The reliability determination module 230 may communicate the reliability line rating 650 for the future time window 628 to a transmission line operator, for example through a display coupled to the reliability determination module 230, so that the transmission line operator may utilize the reliability line rating 650 for the future time window 628 in setting the level of current on the transmission line or planning for future levels to meet anticipated power needs. In some alternative embodiments, the reliability line rating 650 for the future time window 628 is determined to be the reliability line rating for the future interval 626. In other alternative embodiments, the reliability line rating 650 for the future time window 628 is determined based on a plurality of reliability line ratings corresponding to a plurality of future time intervals. For example, FIG. 6C is a diagram showing a plurality of reliability line ratings RLR1-RLR7 for a plurality of future intervals I1-I7 according to embodiments of the present disclosure. The future time window 628C is divided into consecutive intervals I1-I7. Each of the consecutive intervals I1-I7 has a corresponding forecasted dynamic line rating FDLR1-FDLR7 generated as described in block 612.

Based on the forecasted dynamic line ratings FDLR1-FDLR7, each of the consecutive intervals I1-I7 has a corresponding reliability line rating RLR1-RLR7 generated as described in the preferred method described in blocks 606-614. At block 616, the reliability determination module 230 preferably selects the lowest of the plurality of reliability line ratings RLR1-RLR7 for the consecutive intervals I1-I7 to be the reliability line rating for the future time window to be the reliability line rating 650C for the future window 628C.

The scaling factor generated for a consecutive interval I1-I7 forecasted further out may be lower than a scaling factor for a consecutive interval forecasted closer to the present time. For example, the scaling factor for FDLR7 may be lower than the scaling factor for FDLR3. This may be because forecasted environmental conditions may be more accurate closer to the present time. However, sometimes the scaling factor may be similar across each of the consecutive intervals I1-I7. This may occur, for example, where the weather has been stable and can be forecasted reliably.

The description above of the preferred method 600 depicted in FIG. 6B includes references to the system of FIG. 2. In some embodiments, the method 600 of FIG. 6B is performed by the reliability determination module 230 of FIG. 2. However, in other embodiments, the method 600 of FIG. 6B, as described above, is not performed by the system of FIG. 2, and accordingly the disclosure above should not be limited thereto.

Figure 7:
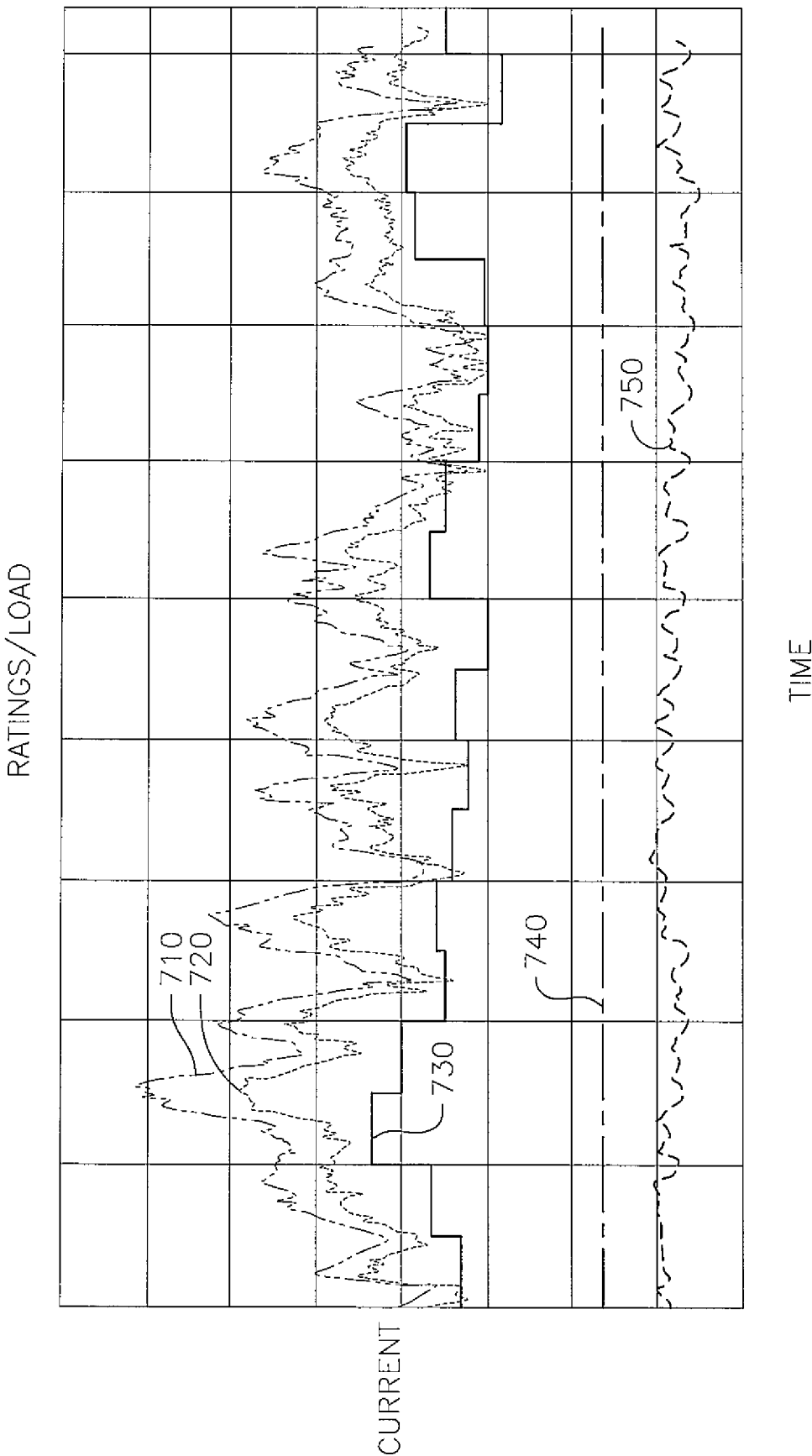
FIG. 7 shows a graph depicting reliability line rating traces according to embodiments of the present disclosure.

FIG. 7 shows a graph 700 depicting reliability line rating traces according to some embodiments of the present disclosure. The graph may have a time axis and a current axis. The graph may include various traces such as a dynamic line rating trace 710, a reliability line rating trace 720, a reliability window trace 730, a static line rating trace 740, or an actual load trace 750. The traces may be for a transmission line or for a particular span of a transmission line. In some embodiments, the reliability determination module 230 may be coupled to a display and the reliability determination module 230 may cause the display to output a graph including one or more of the above traces, or multiples thereof.

Static line ratings, dynamic line ratings and reliability line ratings may measure "ampacity" which is a maximum current capacity for the transmission line. Accordingly, these measurements may be positioned relative to the current axis.

The dynamic line rating trace 710 may show values of the dynamic line rating calculated at different times. A dynamic line rating value for a transmission line changes over time, so the dynamic line rating values may be positioned relative to the time axis. The dynamic line rating trace 710 may, therefore, show dynamic line rating values generated over time and the times for which they were gathered.

The reliability line rating trace 720 may show values of a reliability line rating calculated for different times. Reliability line rating values, when generated (e.g. at a present time), may correspond to a future time. For example, the reliability line rating 550 of FIG. 5 is a reliability line rating for a present interval; the future time may be the time at the end of the present interval. As another example, the reliability line rating 650 of FIG. 6A is a reliability line rating for a future interval; the future time may be a time during the future interval, such as the beginning or the end of the future interval. The reliability line rating trace 720 may show the reliability line rating values positioned relative to the time axis based on their corresponding future times—that is, they may be positioned at the future time, not the time they are calculated. Accordingly, at a given present time, the reliability line rating trace 720 may display values at points on the time axis which are in the future.

The reliability window trace 730 may show values of a reliability line rating calculated for time windows. For example, the reliability line rating 650C of FIG. 6 is a reliability line rating for the time window 628C. The reliability window trace 730 may show the reliability line rating value for a window positioned at all of the points on the time axis included in the window. It may also include consecutive time windows and reliability line rating values for each consecutive time window, and accordingly may display a series of time windows with a single value for each window. For example, in one embodiment, time is divided into a series of one-day-long time windows, and the reliability window trace 730 may display a single reliability line rating for each day. Because reliability line ratings for time windows may be generated for future time windows, the reliability window trace 730 may also display values at points on the time axis in the future.

The static line rating trace 740 may simply show the static line rating for the transmission line at a given time. Accordingly, this trace may display a constant value, or an infrequently changing value. The actual load trace 750 may show the actual current load that was on the transmission line at a given time.

In one embodiment, the graph includes a first trace which is a reliability window trace 730, a second trace which may be a reliability line rating trace 720 or another reliability window trace, and a dynamic line rating trace. The first trace may be to show longer-term reliability, and the second trace may be to show short term (e.g. emergency) reliability. For example, the first trace may display reliability line rating values for one-day windows. A utility may use this trace for planning purposes. The second trace may display reliability line ratings for short windows, such as a one or two hour window, or may display continuously generated reliability line rating values for one or two hours in the future. A utility may use this trace to anticipate or identify emergency situations, such as where the reliability line rating may drop below the actual load in the near future without action from the utility.

In some embodiments, the display may be part of a user interface (e.g. a graphical user interface). The user interface may be coupled to an energy management system or another system controlling the current on the transmission line. A user may be able to select a point on the graph. The user interface will communicate the current level associated with the selected point to the energy management system or other system which will use (or attempt to use) that current level as the current load for the transmission line. As the user may make the selection on the same graph as the traces, the user may use the information they contain in making his or her decision. The user may user the future values of a reliability line rating trace 720 and/or a reliability window trace 730 to determine what level he or she can reliably select, and may use their historical values compared to other traces (such as a dynamic line rating trace 710, a static line rating trace 740, and an actual load trace 750) to determine what level of confidence he or she should attribute to the reliability line rating trace 720 and/or reliability window trace 730.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

While this invention has been described in detail with particular references to preferred embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as defined by the following claims and equivalents thereof.

What is claimed is:

1. A system for determining a reliability line rating for a transmission line during a present interval, the system comprising:
   a line monitor on a transmission line, the line monitor comprising:
   a clearance sensor to determine a line clearance measurement;
   a line temperature sensor to determine a line temperature measurement;
   a line current sensor to determine a line electrical load; and
   a transmitter to transmit the line clearance measurement and the line temperature measurement to a reliability determination module disposed on a remote utility server, the reliability determination module configured to:
   in response to the line clearance measurement and the line temperature measurement, generate a temperature-clearance model for the transmission line based on the received line clearance measurement and line temperature measurement;
   generate a plurality of past dynamic line ratings based on a maximum line temperature for the transmission line, wherein the maximum line temperature is determined by comparing a minimum acceptable clearance for the transmission line to the temperature-clearance model;
determine a scaling factor based on the plurality of past dynamic line ratings;
generate a present dynamic line rating at a start of a present interval; and
scale the present dynamic line rating in response to the scaling factor to obtain a reliability line rating for the present interval.

2. The system of claim 1, wherein the clearance sensor is a LIDAR clearance sensor.

3. The system of claim 1, wherein:
the line monitor further comprises one or more environmental condition sensors generating corresponding environmental condition measurements usable by the reliability determination module on the remote utility server to generate the dynamic line rating.

4. The system of claim 1 wherein the reliability determination module is configured to
determine a mean value of the plurality of past dynamic line ratings,
determine a cutoff value of the plurality of past dynamic line ratings, the cutoff value being based on a confidence level, and
determine the scaling factor by dividing the cutoff value by the mean value.

5. The system of claim 4 wherein the reliability determination module is configured to multiply the present dynamic line rating by the scaling factor to obtain the reliability line rating for the present interval.

6. The system of claim 1 wherein the reliability determination module is configured to
determine a plurality of error level values based on the plurality of past dynamic line ratings, and
determine the scaling factor based on the plurality of error level values.

7. The system of claim 1, further comprising a display coupled to the reliability determination module, wherein:
the reliability determination module is configured to cause the display to output a reliability line rating trace, a dynamic line rating trace, and an actual load trace on a graph having a time axis and a current axis,
the reliability line rating trace includes values of the reliability line rating at corresponding times,
the dynamic line rating trace includes values of the present dynamic line rating at corresponding times, and
the actual load trace includes values of a current on the transmission line at corresponding times.

8. The system of claim 1, wherein the reliability determination module is further configured to limit a level of current that may be applied to the transmission line during the present interval to the reliability line rating for the present interval.

9. A system for determining a reliability line rating during a future time window for a transmission line comprising:
a line monitor on a transmission line, the line monitor comprising a clearance sensor to determine a line clearance measurement, a line temperature sensor to determine a line temperature measurement, and a line current sensor to determine a line electrical load; and
a reliability determination module disposed on a remote utility server, the reliability determination module configured to:
in response to the line clearance measurement and the line temperature measurement generate a temperature-clearance model for the transmission line based on the received line clearance measurement and line temperature measurement;
generate a plurality of past dynamic line ratings;
receive forecasted environmental variables corresponding to a future interval;
generate a plurality of past forecasted dynamic line ratings corresponding to the future interval;
generate a plurality of error level values for the future interval based on the plurality of past forecasted dynamic line ratings and the plurality of past dynamic line ratings;
generate a current forecasted dynamic line rating for the future interval;
determine a scaling factor based on the plurality of error level values; and
scale the current forecasted dynamic line rating in response to the scaling factor to obtain a reliability rating for the future interval.

10. The system of claim 9, wherein:
the future time window contains a plurality of future intervals,
the reliability determination module is further configured to obtain a reliability line rating for each future interval of the plurality of future intervals, thereby obtaining a plurality of reliability line ratings, and
the reliability determination module determines the lowest of the plurality of reliability line ratings to obtain the reliability line rating for the future window.

11. The system of claim 10, further comprising a display coupled to the reliability determination module, wherein:
the reliability determination module is configured to cause the display to output a first reliability line rating trace and a dynamic line rating trace on a graph having a time axis and a current axis,
the first reliability line rating trace includes the value of the reliability line rating for the future window at the times corresponding to the future window, and
the dynamic line rating trace includes values of a dynamic line rating at corresponding times.

12. The system of claim 11, wherein the reliability determination module is further configured to:
determine a second reliability line rating during a second future window, the second future window being shorter than the future time window; and
cause the display to further output a second reliability line rating trace on the graph, wherein the second reliability line rating trace includes the value of the second reliability line rating for the second future window at the times corresponding to the second future window.

13. The system of claim 9, wherein the reliability determination module is configured to
determine a mean value of the plurality of error level values;
determine a cutoff value for the plurality of error level values, the cutoff value being based on a confidence level; and
determine the scaling factor by dividing the cutoff value by the mean value.

14. A system for determining that a clearance obstruction has occurred in an environment of a transmission line, the system comprising:
a line monitor on a transmission line comprising a clearance sensor to take line clearance measurements and a line temperature sensor to take line temperature measurements; and a reliability determination module disposed on a remote utility server, the reliability determination module configured to:
  generate a temperature-clearance model for the transmission line based on the received line clearance measurements and line temperature measurements;
  receive new line clearance measurements and line temperature measurements;
  update the temperature-clearance model based on the received new line clearance measurements and new line temperature measurements;
  monitor the temperature-clearance model for a change to the updated temperature-clearance model; and
  determine that a clearance obstruction has occurred in an environment of the transmission line based on the change to the updated temperature-clearance model.

15. The system of claim 14 wherein the reliability determination module monitors the temperature-clearance model for the change to the updated temperature-clearance model by monitoring a value of a Y-intercept of the temperature-clearance model.

16. The system of claim 14 wherein the reliability determination module monitors the temperature-clearance model for the change to the updated temperature-clearance model by monitoring the slope of the temperature-clearance model.

17. A system for determining a reliability line rating for a transmission line during an interval, the system comprising:
  a processor;
  a memory, wherein the memory has stored therein instructions that, when executed by the processor, cause the processor to:
    in response to a line clearance measurement and a line temperature measurement received from a transmission line monitor coupled to a transmission line, generate a temperature-clearance model for the transmission line based on the received line clearance measurement and line temperature measurement;
    generate a plurality of past dynamic line ratings based on a maximum line temperature for the transmission line, wherein the maximum line temperature is determined by comparing a minimum acceptable clearance for the transmission line to the temperature-clearance model;
    determine a scaling factor based on the plurality of past dynamic line ratings;
    generate a dynamic line rating for an interval; and
    scale the dynamic line rating in response to the scaling factor to obtain a reliability line rating for the interval.

18. The system of claim 17, wherein the dynamic line rating is a present dynamic line rating.

19. The system of claim 18, wherein the instructions further cause the processor to:
  in response to a plurality of environmental condition measurements received from the transmission line monitor, generate the present dynamic line rating.

20. The system of claim 18, wherein the interval is a future interval and the dynamic line rating is a future dynamic line rating, and wherein the instructions further cause the processor to:
  in response to forecasted environmental variables for the future interval, generate a plurality of past forecasted dynamic line ratings corresponding to the future interval;
  generate a plurality of error level values for the future interval based on the plurality of past forecasted dynamic line ratings and the plurality of past dynamic line ratings;
  in response to forecasted environmental variables for the future interval, generate a present forecasted line rating for the future interval; and
  determine the scaling factor based on the plurality of error level values.

* * * * *